United States Patent
Rachmady et al.

(10) Patent No.: US 10,461,082 B2
(45) Date of Patent: Oct. 29, 2019

(54) WELL-BASED INTEGRATION OF HETEROEPITAXIAL N-TYPE TRANSISTORS WITH P-TYPE TRANSISTORS

(71) Applicant: Intel Corporation, Santa Clara, CA (US)

(72) Inventors: Willy Rachmady, Beaverton, OR (US); Matthew V. Metz, Portland, OR (US); Gilbert Dewey, Hillsboro, OR (US); Chandra S. Mohapatra, Beaverton, OR (US); Jack T. Kavalieros, Portland, OR (US); Anand S. Murthy, Portland, OR (US); Nadia M. Rahhal-Orabi, Lake Oswego, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/577,734

(22) PCT Filed: Jun. 26, 2015

(86) PCT No.: PCT/US2015/038091
§ 371 (c)(1),
(2) Date: Nov. 28, 2017

(87) PCT Pub. No.: WO2016/209281
PCT Pub. Date: Dec. 29, 2016

(65) Prior Publication Data
US 2018/0130801 A1    May 10, 2018

(51) Int. Cl.
*H01L 27/092* (2006.01)
*H01L 21/8238* (2006.01)
(Continued)

(52) U.S. Cl.
CPC ...... *H01L 27/0924* (2013.01); *H01L 21/8258* (2013.01); *H01L 21/823807* (2013.01); *H01L 21/823821* (2013.01); *H01L 29/1054* (2013.01)

(58) Field of Classification Search
CPC ..... H01L 21/823807; H01L 21/823821; H01L 21/02647
See application file for complete search history.

(56) References Cited

U.S. PATENT DOCUMENTS 8,253,211 B2 *   8/2012   Cheng .............. H01L 21/02532
                                                    257/431
8,916,445 B1 *  12/2014   Leobandung ..... H01L 21/02647
                                                    257/E21.09
(Continued)

FOREIGN PATENT DOCUMENTS

JP   2011233894   11/2011
WO  2006006438    1/2006

OTHER PUBLICATIONS

International Preliminary Report on Patentability from PCT/US2015/038091 notified Jan. 4, 2018, 7 pgs.
(Continued)

*Primary Examiner* — Charles D Garber
*Assistant Examiner* — Alia Sabur
(74) *Attorney, Agent, or Firm* — Green, Howard & Mughal LLP

(57) ABSTRACT

Non-silicon fin structures extend from a crystalline heteroepitaxial well material in a well recess of a substrate. III-V finFETs may be formed on the fin structures within the well recess while group IV finFETs are formed in a region of the substrate adjacent to the well recess. The well material may be electrically isolated from the substrate by an amorphous isolation material surrounding pillars passing through the isolation material that couple the well material to a (Continued)

seeding surface of the substrate and trap crystal growth defects. The pillars may be expanded over the well-isolation material by lateral epitaxial overgrowth, and the well recess filled with a single crystal of high quality. Well material may be planarized with adjacent substrate regions. N-type fin structures may be fabricated from the well material in succession with p-type fin structures fabricated from the substrate, or second epitaxial well.

20 Claims, 11 Drawing Sheets

(51) Int. Cl.
*H01L 21/8258* (2006.01)
*H01L 29/10* (2006.01)

(56) References Cited

U.S. PATENT DOCUMENTS

| | | | | |
|---|---|---|---|---|
| 9,466,702 | B1* | 10/2016 | Balakrishnan | H01L 29/66795 |
| 9,548,319 | B2* | 1/2017 | Jagannathan | H01L 21/02609 |
| 2009/0159972 | A1 | 6/2009 | Jakschik et al. | |
| 2010/0078680 | A1 | 4/2010 | Cheng et al. | |
| 2011/0045648 | A1 | 2/2011 | Knorr et al. | |
| 2011/0049568 | A1 | 3/2011 | Lochtefeld et al. | |
| 2012/0028444 | A1* | 2/2012 | Vellianitis | H01L 21/02381 438/478 |
| 2013/0233238 | A1* | 9/2013 | Vincent | C30B 19/00 117/58 |
| 2014/0027860 | A1 | 1/2014 | Glass et al. | |
| 2014/0217467 | A1 | 8/2014 | Pawlak et al. | |
| 2015/0028454 | A1 | 1/2015 | Cheng et al. | |
| 2015/0035019 | A1 | 2/2015 | Song et al. | |
| 2015/0076620 | A1* | 3/2015 | Waldron | H01L 29/20 257/401 |
| 2015/0091057 | A1* | 4/2015 | Xie | H01L 27/0924 257/190 |
| 2015/0102454 | A1* | 4/2015 | Cheng | H01L 27/0886 257/506 |
| 2016/0315174 | A1* | 10/2016 | Basker | H01L 29/66795 |
| 2016/0379894 | A1* | 12/2016 | Hashemi | H01L 21/823821 438/427 |
| 2017/0345654 | A1* | 11/2017 | Caimi | H01L 29/7851 |
| 2017/0365692 | A1* | 12/2017 | Leobandung | H01L 29/66795 |

OTHER PUBLICATIONS

International Search Report and Written Opinion from PCT/US2015/038091 notified Feb. 23, 2016, 8 pgs.

Extended European Search Report from European Patent Application No. 15896567.3 notified Jan. 21, 2019, 12 pgs.

* cited by examiner

WELL-BASED INTEGRATION OF HETEROEPITAXIAL N-TYPE TRANSISTORS WITH P-TYPE TRANSISTORS

CLAIM OF PRIORITY

This Application is a National Stage Entry of, and claims priority to, PCT Application No. PCT/US2015/038091, filed on 26 Jun. 2015 and titled "WELL-BASED INTEGRATION OF HETEROEPITAXIAL N-TYPE TRANSISTORS WITH P-TYPE TRANSISTORS", which is incorporated by reference in its entirety for all purposes.

BACKGROUND

Demand for integrated circuits (ICs) in portable electronic applications has motivated greater levels of semiconductor device integration. Many advanced semiconductor devices in development leverage non-silicon semiconductor materials, including compound semiconductor materials (e.g., GaAs, InP, InGaAs, InAs, and III-N materials). These non-silicon material systems may be employed to fabricate metal oxide semiconductor field effect transistors (MOSFETs) and other forms of high mobility transistors (HEMT). Non-silicon material systems are also useful for photonics (e.g., LEDs), photovoltaics, and sensors, one or more of which may be useful to integrate with silicon-based devices in an electronic device platform.

One technique for fabricating non-silicon transistors includes forming a non-planar, non-silicon crystalline device region (e.g., a fin channel region) over a silicon substrate. The device region material and/or an underlying material form at least one heterostructure with the substrate. While such heterostructures in theory enable monolithic integration of high performance N-type devices with conventional silicon-channeled P-type devices, divergent device architectures have thus far made high volume manufacturing of CMOS circuits employing heteroepitaxial N-type devices impractical.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
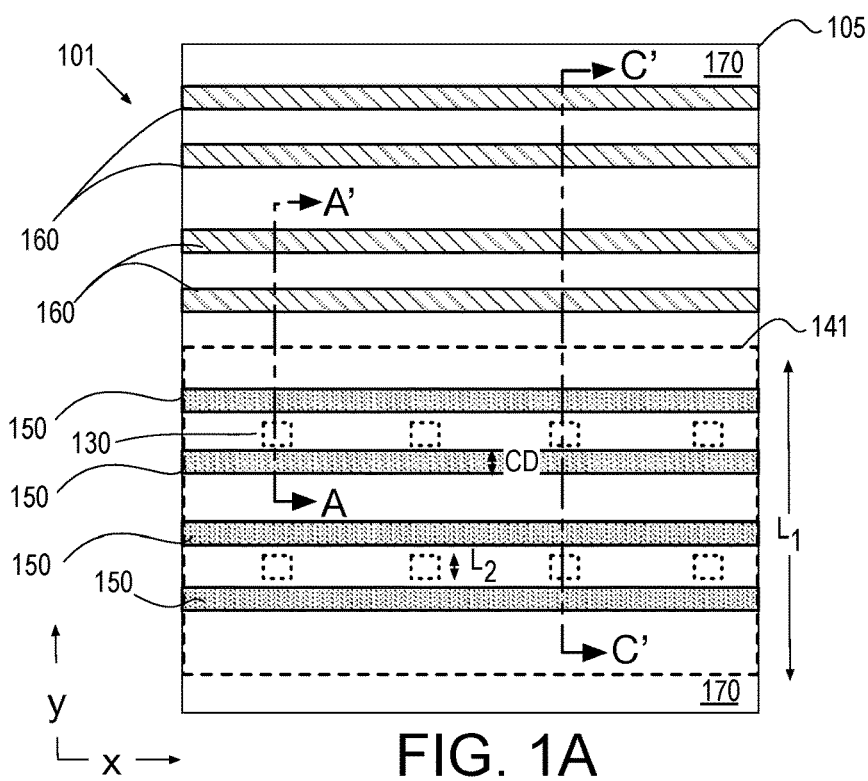
FIG. 1A is a plan view of a plurality of well-based heteroepitaxial n-type fins structures integrated with a plurality of p-type fin structures over a silicon substrate suitable for fabricating complementary finFETs to implement a CMOS integrated circuit (IC), in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Exemplary embodiments of non-silicon fin structures extending from a monocrystalline heteroepitaxial well material embedded within a well recess of a silicon substrate are described below. In some embodiments, devices, such as III-V finFETs, are formed on the raised fin structures while group IV finFETs are formed in a region of the silicon substrate adjacent to the well recess. In some embodiments, the heteroepitaxial well material is substantially isolated from the substrate by an amorphous isolation material except for one or more heteroepitaxial pillars passing through the well-isolation material that couple the heteroepitaxial well material to a seeding surface of the substrate and further serve to improve crystal quality of the heteroepitaxial well material through aspect ratio trapping (ART). Lateral epitaxial overgrowth is employed to expand a pillar over the well-isolation material. The remainder of the well recess is back-filled with growth of a crystal of high quality. Once the heteroepitaxial well material is grown and planarized with the adjacent substrate regions, n-type fin structures may be fabricated from the well material in succession with p-type fin structures fabricated from an adjacent region of the substrate, or a second epitaxial well.

Notably, some embodiments herein employ both aspect ratio trapping (ART) epitaxial techniques and lateral epitaxial overgrowth techniques to fabricate islands of a mono/single-crystalline material (e.g., a III-V material) that have both a sufficiently low dislocation density and a sufficiently large footprint to be further processed into a plurality of high-quality single-crystalline n-type fins in a manner compatible with p-type fin fabrication in adjacent regions of the substrate. To facilitate planar processing, important for example in lithographic patterning of the fin structures, the single-crystalline material is overgrown within a well recess in the substrate and planarized to a level of the surrounding substrate.

In some embodiments further described below, a plurality of equilateral polygonal openings are formed in a well-isolation material to expose a substrate seeding surface. Heteroepitaxial pillars grown within the openings are confined in two lateral dimensions, enhancing aspect ratio trapping within the pillar and improving quality of well material subsequently overgrown from the pillar.

FIG. 1A is a plan view of a plurality of n-type fin structures 150 adjacent to a plurality of p-type fin structures 160, both of which are disposed over a silicon substrate 105, in accordance with some embodiments. Fin structures 150, 160 are components of a monolithic fin structure 101 suitable for fabricating complementary finFETs to implement a CMOS integrated circuit (IC). Fin structures 150, 160 are to serves as a device layer, for example providing at least the carrier conduction channel. As used herein, the terms "n-type" and "p-type" are in reference to the type of majority carrier (electron or hole) of a FET employing the fin as channel material. In the exemplary embodiments, the "n-type" and "p-type" fins 150, 160 are differentiated by distinct bulk lattice materials. For example, in some advantageous embodiments each n-type fin structure 150 is a III-V material (e.g., GaAs, InP, InAs, InGaAs, AlGaAs, GaP, AlAs, InGaP). N-type majority carrier devices (e.g., NMOS FETS) employing III-V materials are advantageous at least in part due to high electron mobility.

Although exemplary III-V n-type fin structures and III-V n-type finFET embodiments are employed consistently herein for the sake of clarity of discussion, it is expected one of skill in the art familiar with the characteristics of alternate semiconductor material systems will be able to successfully apply the techniques described herein to other heteroepitaxial fin structures absent some specific a priori knowledge of a salient incompatibility between the exemplary III-V embodiments and the alternate material system. For example, alternative non-silicon material systems, such as but not limited to, the III-N material system (e.g., AlN, GaN, AlGaN, InAlGaN) may also be amenable to the techniques and architectures described herein.

In some embodiments, p-type fin structures 160 are to provide a semiconductor channel region that is a group IV material (e.g., Si, Ge, SiGe). P-type majority carrier devices employing group IV materials are advantageous at least in part due to high hole mobility. Either or both of fin structures 150, 160 may be intrinsic (no deliberately introduced extrinsic doping) for highest carrier mobility. Alternatively, either or both of fin structures 150, 160 may be doped with an electrically active impurity, for example to tune threshold voltages ($V_t$) of a FET. Selected portions of fin structures 150, 160 may also be extrinsically doped, for example when source/drain ends are subsequently defined.

In one exemplary embodiment, substrate 105 is silicon (Si), which is advantageous to monolithically integrate non-silicon FET 101 with conventional silicon-channeled MOSFETs (not depicted). Crystallographic orientation of a substantially monocrystalline Si substrate may be any of (100), (111), or (110). Other crystallographic orientations are also possible. For example, the semiconductor surface may be miscut, or offcut, for example 2-10° toward [110], for example to facilitate nucleation of monocrystalline heteroepitaxial material. Other substrate embodiments are also possible, for example with substrate 105 being any of silicon-carbide (SiC), sapphire, a III-V compound semiconductor (e.g., GaAs), a silicon on insulator (SOI) substrate, germanium (Ge), or silicon-germanium (SiGe).

Each n-type fin structure 150 and p-type fin structure 160 is a non-planar semiconductor body protruding beyond a surrounding amorphous fin-isolation material 170 disposed over substrate 105. Amorphous fin-isolation material 170 may be any material suitable for providing electrical isolation between transistors employing different fins that are not otherwise coupled together. In some exemplary embodiments, fin-isolation material 170 is silicon dioxide. Other suitable materials include low-k materials (e.g., relative dielectric constant below 2.5). Although embodiments are not limited in this respect, other exemplary fin-isolation materials include carbon-doped oxides, siloxane derivatives and polymer dielectrics (e.g., benzocyclobutene, porous methyl silsesquioxane). In some embodiments, each n-type fin structure 150 and p-type fin structure 160 is monocrystalline, with a shortest lateral length in a first dimension (e.g., y) and a longest lateral length in a second dimension (e.g. x). Critical dimensions may very between n-type fin structure 150 and p-type fin structure 160, but in exemplary embodiments both are less than 20 nm, and advantageously less than 10 nm. Fin structures may have longest lengths that are many microns, and even many hundreds of microns long, allowing each fin structure 150, 160 to be subsequently bifurcated into many distinct finFETs.

In some embodiments, at least one of the n-type fin structures 150 and p-type fin structures 160 extend from single-crystalline heteroepitaxial well material contained within a well recess in substrate 105. In the exemplary embodiment, n-type fin structures 150 are disposed over well recess 141, denoted in dashed line as being disposed below fin-isolation material 170. P-type fin structures 160 are not disposed over any well recess, and instead extend directly from a surface of substrate 105. Well recess 141 has a minimum lateral dimension that is significantly larger than the CD of n-type fin structure 150. In the exemplary embodiments illustrated in FIG. 1A, well recess 141 has a minimum lateral dimension that is significantly larger than the n-type fin structure 150 pitch such that a plurality of n-type fin structure 150 are arrayed across the minimum lateral well recess dimension $L_1$. Although minimum lateral well recess dimension $L_1$ may vary, in some exemplary embodiments $L_1$ is between 150 μm and 200 μm.

In some embodiments, heteroepitaxial pillars minimally couple the single-crystalline well material to a seeding surface of the substrate. Each pillar has a minimum lateral dimension that is significantly smaller than a minimum lateral dimension of the crystalline well material, so as to terminate dislocations in the epitaxial material rapidly as the defects run out to the pillar sidewalls during epitaxial growth of the pillar. This technique, often referred to as aspect ratio trapping (ART) may be implemented in one lateral dimension by an asymmetric trench. However in advantageous embodiments, both orthogonal lateral dimensions of each pillar are significantly smaller than a minimum lateral dimension of the crystalline well material, so as to provide bi-directional defect trapping. Specific lateral dimensions of a pillar may vary as a function of the z-height of an ART structure. However, in exemplary embodiments illustrated in FIG. 1A, a longest lateral dimension of the pillar $L_2$ is at least an order of magnitude smaller than the minimum lateral well dimension $L_1$, and more advantageously two orders of magnitude smaller. In some embodiments where $L_1$ is over 100 μm, $L_2$ is less than 10 μm. In some embodiments where $L_1$ is between 150 μm and 200 μm, $L_2$ is between 0.1 μm and 2 μm. For bi-directional ART embodiments, each pillar may have orthogonal lateral dimensions of $L_2$ (i.e., approximately square or round).

As further illustrated in FIG. 1A, a plurality of heteroepitaxial pillars 130 is arrayed over a lateral area of well recess 141. While each pillar 130 is dimensioned to achieve enhanced bi-directional ART, the multiplicity of heteroepitaxial pillars 130 facilitates laterally overgrowing a crystalline well material from pillars 130 that is of sufficiently large lateral dimension to enable formation of N-type fin structures 150. Spacing of heteroepitaxial pillars 130 may be predetermined to satisfy any lateral overgrowth rate relationships (e.g., lateral:vertical growth rate ratio) required to merge disparate pillar seeding locations into a crystalline well material of desired z-thickness.

In some embodiments, both n-type fin structures and p-type fin structures extend from a crystalline heteroepitaxial well material, each contained within a well recess in a substrate. For such dual-well embodiments, the n-type heteroepitaxial well layout may be substantially as described above in the context of FIG. 1A, with the addition of a p-type well material epitaxially grown from the substrate. Such an architecture may for example enable biaxial fin strain and/or crystalline material composition based threshold voltage tuning, etc. In some embodiments, a heteroepitaxial group IV well material is disposed within second well recess in a region of the substrate adjacent to the first well recess containing heteroepitaxial III-V (or III-N) well material.

Figure 1B:
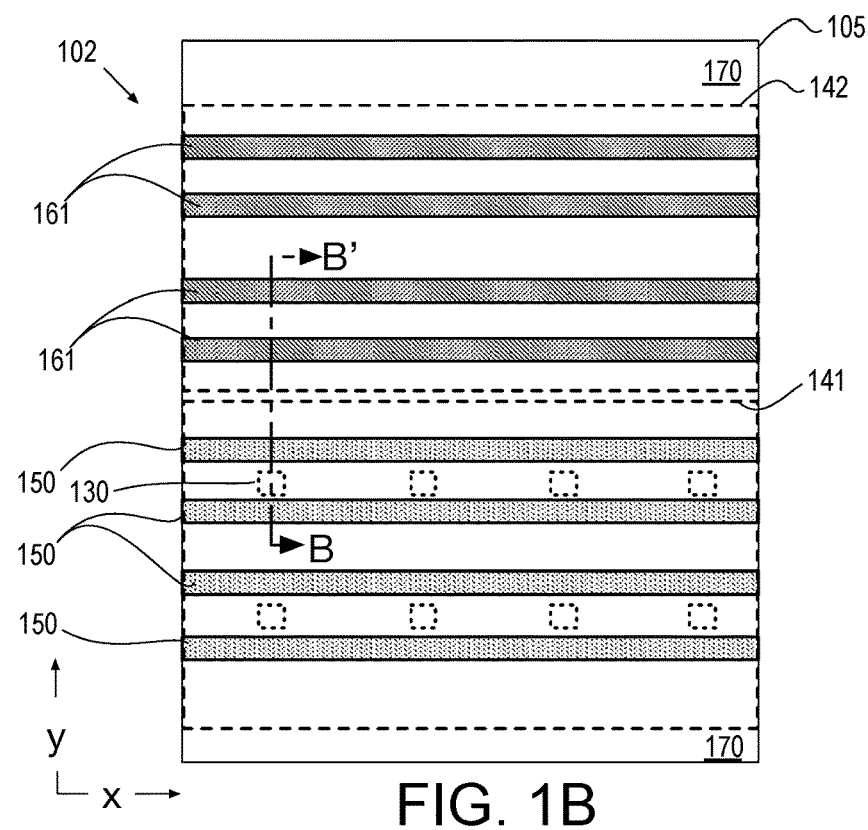
FIG. 1B is a plan view of a plurality of well-based heteroepitaxial n-type fins structures integrated with a plurality of p-type fin structures over a silicon substrate suitable for fabricating complementary finFETs to implement a CMOS integrated circuit (IC), in accordance with some alternate embodiments.

FIG. 1B is a plan view of a plurality of n-type fin structures 150 and p-type fin structures 161 disposed over a silicon substrate 105. N-type fin structures 150 and p-type fin structures 161 are components of a monolithic structure 102 suitable for fabricating complementary finFETs to implement a CMOS integrated circuit (IC), in accordance with some alternate embodiments. In the exemplary embodiments illustrated in FIG. 1B, p-type fin structures 161 are disposed over a second well recess 142 in a second region of substrate 105 adjacent to well recess 141. No heteroepitaxial (ART) pillars are employed within well recess 142. Noting that lateral dimensions of ART structures are a function of at least lattice mismatch between the seeding surface (e.g., Si) and heteroepitaxial material, ART structures may in some instances be avoided where the heteroepitaxial well material lattice spacing is a sufficiently close match with the substrate. In some silicon substrate embodiments, for example, a SiGe alloy may be epitaxially grown within well recess 142 without ART structures.

Figure 2A:
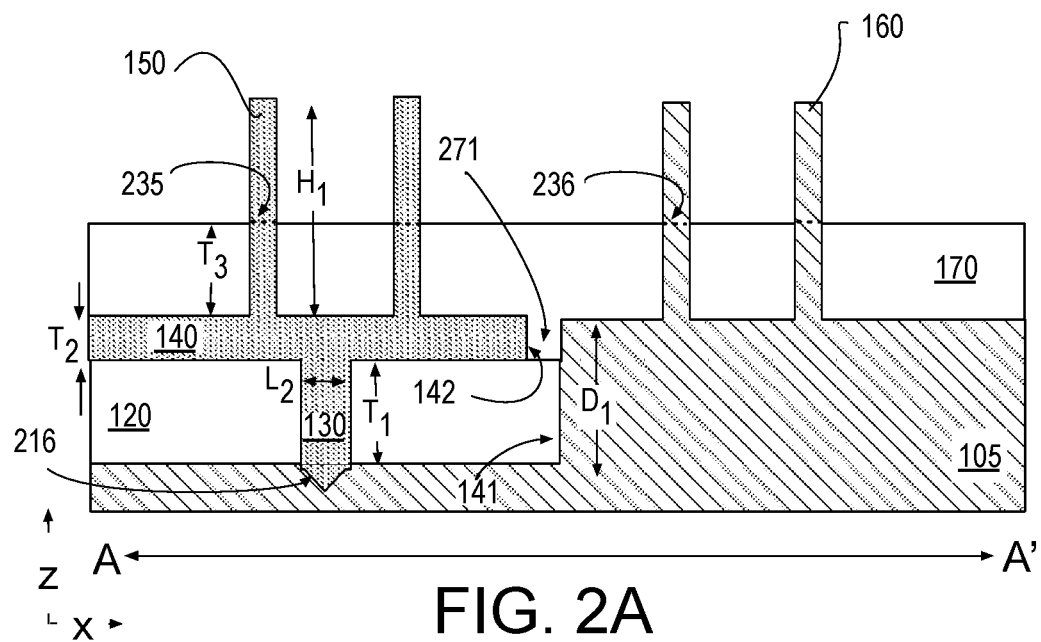
FIG. 2A illustrates a cross-sectional view through a width of a plurality of n-type and p-type fin structures depicted in FIG. 1A, in accordance with some embodiments.

FIG. 2A illustrates a cross-sectional view through a width of a plurality of n-type and p-type fin structures along the A-A' line depicted in FIG. 1A, in accordance with some embodiments. As shown, n-type fin structure 150 extends in a z-direction from crystalline heteroepitaxial well material 140. In some embodiments represented by FIG. 2A, fin structure 150 is of the single-crystalline heteroepitaxial well material 140 (i.e., fin structure 150 is a part of well material 140). For example, in embodiments where n-type fin structure 150 is a III-V material, well material 140 is the same III-V material as n-type fin structure 150. For such embodiments, well material 140 forms one heterojunction at the interface with substrate seeding surface 216.

In some embodiments however, fin structure 150 is a hetero-fin that further includes one or more additional heterojunction 235. For example, single-crystalline heteroepitaxial well material 140 may interface with a distinct material at an interface demarking a fin portion from a sub-fin portion of the hetero-fin. N-type fin structure 150 may extend from a surface of well material 140 by any height $H_1$ to protrude through fin-isolation material 170 of thickness $T_3$. In some hetero-fin embodiments, fin heterojunction 235 is ideally approximately planar with the surface of surrounding fin-isolation material 170 (i.e., at a z-height of $T_3$ as measured from a top surface of heteroepitaxial well material 140).

As further illustrated in FIG. 2A, heteroepitaxial well material 140 is disposed over an amorphous well-isolation material 120 that is disposed over a bottom of well recess 141. In the illustrative embodiment, well-isolation material 120 interfaces with a surface of substrate 105 surrounding heteroepitaxial seeding surface 216. Well-isolation material 120 may be any amorphous material suitable for providing electrical isolation between substrate 105 and epitaxial well material 140. In some exemplary embodiments, well-isolation material 120 is silicon dioxide. Other known materials may also be employed, including low-k materials having a relative dielectric constant below 2.5. Although embodiments are not limited in this respect, other exemplary well-isolation materials include carbon-doped oxides, siloxane derivatives, and the like. Well-isolation material 120 is also the material in which ART windows are defined to facilitate defect trapping within heteroepitaxial pillar 130 and enable high crystal quality within crystalline well material 140. Well-isolation material 120 should therefore have a thickness $T_1$ sufficient for pillars 130 to achieve an aspect ratio ($T_1:L_1$) of at least 2:1, and advantageously 3:1, or more. Well recess 141 should therefore have a depth $D_1$ sufficient to accommodate isolation material 120 of thickness $T_1$ and crystalline well material 140 of a thickness $T_2$.

In some embodiments, monocrystalline well material 140 has a non-zero thickness $T_2$ such that a continuous crystalline well material connects the plurality of n-type fin structures 150 together. Such a continuous crystalline structure may advantageously prevent n-type fin structures 150 from peeling or delaminating from an underlying amorphous well-isolation material 120. From a mechanical standpoint, pillars 130 may help to anchor crystalline well material 140 to substrate 105. N-type fin structures 150 in turn, are integral with well material 140. In some embodiments, a top surface of crystalline well material 140 is planar with a top surface of well recess 141. In other words, the crystalline well material is embedded within the recess to be substantially flush with the substrate surface such that the sum of isolation material thickness $T_1$ and crystalline well material thickness $T_2$ is equal to recess well depth $D_1$.

As noted above, heteroepitaxial pillars 130 may have equilateral polygonal footprints of lateral dimension $L_2$ that is sufficiently small to provide a desired aspect ratio controlling defect propagation during heteroepitaxial growth of crystalline pillar material. Well material 140 shares the crystallinity of heteroepitaxial pillars 130. Because heteroepitaxial pillars 130 are seeded by substrate seeding surface 216 and have a same crystal orientation, well material 140 is referred to herein as "crystallographically coupled" to seeding surface 216 by the one or more heteroepitaxial pillars 130 extending through well-isolation material 120. N-type fin structures 150, sharing the same crystal structure as well material 140, are likewise crystallographically coupled to seeding surface 216.

Notably, there may be a marked difference in dislocation density between heteroepitaxial pillars 130 and n-type fin structures 150 for embodiments where lattice mismatch between the heteroepitaxial pillar material and substrate material are significant. In some embodiments for example, threading dislocation density within n-type fin structures 150 is at least three orders of magnitude less than threading dislocation density within pillars 130, and advantageously four, or more, orders of magnitude less. Such an improvement in crystal quality is a hallmark of a successful implementation of the ART epitaxy technique and may be readily detected with transmission electron microscopy (TEM) techniques. For example, a TEM slice along the A-A' line might show zero threading dislocations within well material 140 and n-type fin structures 150, which at some of dimensions described herein would correspond to a threading dislocation density below $10^6/cm^2$. Within that same slice, more than one threading dislocation may be visible within pillars 130, which at some of dimensions described herein would correspond to a threading a dislocation density of at least $10^9/cm^2$ (e.g., $10^{10}$-$10^{11}/cm^2$).

In some embodiments, amorphous fin-isolation material extends around a sidewall of the crystalline heteroepitaxial material disposed over the well-isolation material, electrically insulating the crystalline heteroepitaxial material from adjacent regions of the substrate. As illustrated in FIG. 2A, for example, fin-isolation material 170 covers well material sidewall 142 and fills a lateral gap 271 between well material 140 and substrate 105 to contact well-isolation material 120. Heteroepitaxial pillars 130 are then the only semiconducting path to substrate 105, ensuring high resistance/low leakage current between n-type fin structures 150 and substrate 105.

FIG. 2A also further illustrates p-type fin structures 160 extending from a second region of substrate 105 and protruding through fin-isolation material 170. In the exemplary embodiment depicted, p-type fin structures 160 are patterned structures of monocrystalline silicon substrate 105. In other embodiments, p-type fin structures 160 are hetero-fins with a group IV heteroepitaxial fin (SiGe, or Ge) disposed over a silicon sub-fin, forming a heterojunction 236. As shown in FIG. 2A, because of planarity between the top surfaces of heteroepitaxial well material 140 and substrate 105, p-type fin structures 160 have substantially the same z-height as n-type fin structures 150 (i.e., $H_1$). Fin-isolation material 170 of a substantially uniform thickness $T_3$ then leaves approximately the same amount of p-type and n-type fin structure exposed for use in transistor formation. Of course, with the top surfaces of heteroepitaxial well material 140 and substrate 105 being planar, fin-isolation material 170 may be readily thinned in the n-type region relative to that in the p-type region (or vice versa) to modulate transistor channel current carrying widths.

Figure 2B:
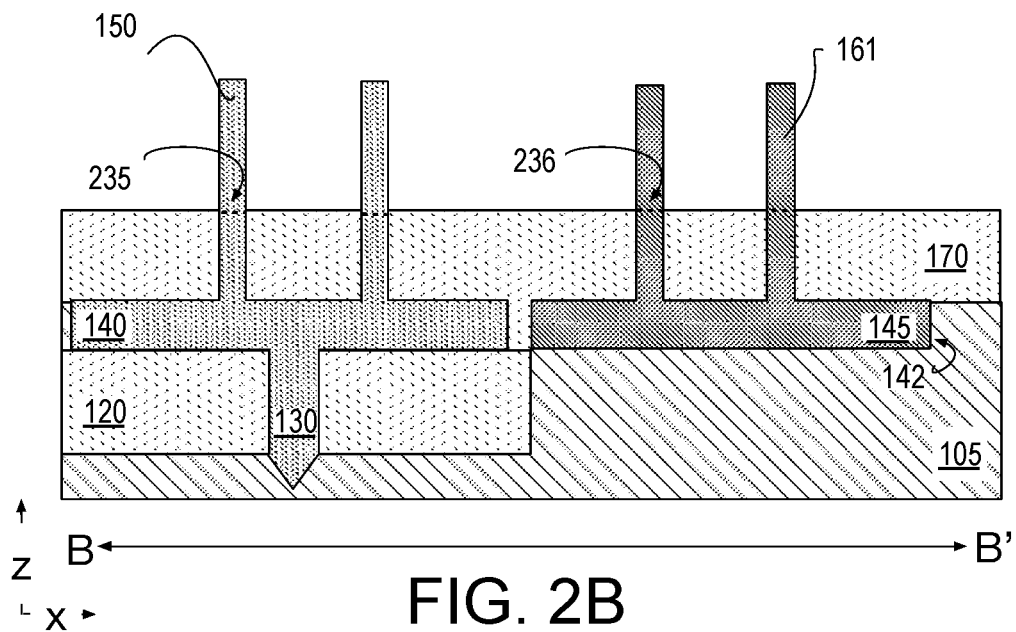
FIG. 2B illustrates a cross-sectional view through a width of a plurality of n-type and p-type fin structures depicted in FIG. 1B, in accordance with some embodiments.

FIG. 2B illustrates a cross-sectional view through a width of a plurality of n-type and p-type fin structures along the B-B' line depicted in FIG. 1B, in accordance with some embodiments. FIG. 2B illustrates the same features depicted in FIG. 2A for n-type fin structures 150. P-type fin structures 161 however are disposed over a second well recess 142 that is backfilled with heteroepitaxial well material 145, which in exemplary silicon substrate embodiments is a group IV material other than silicon (e.g. SiGe or Ge). In some embodiments illustrated by FIG. 2B, well recess 142 is significantly shallower than well recess 141, and lacks dielectric isolation in reliance on well-isolation 120. As noted above in the context of FIG. 1B, heteroepitaxial well material 145 need not be disposed on ART structures (i.e., lacking an equivalent to heteroepitaxial pillars 130) where lattice mismatch between p-type heteroepitaxial well material 145 and substrate 105 is significantly less than for the n-type heteroepitaxial material (e.g., III-V). In further embodiments, p-type fin structures 161 may also be heterofins with a group IV heteroepitaxial fin (e.g., Si, Ge, or first SiGe alloy) disposed over a group IV sub-fin (e.g., Ge or second SiGe alloy) heteroepitaxial forming a second heterojunction 236.

Figure 3:
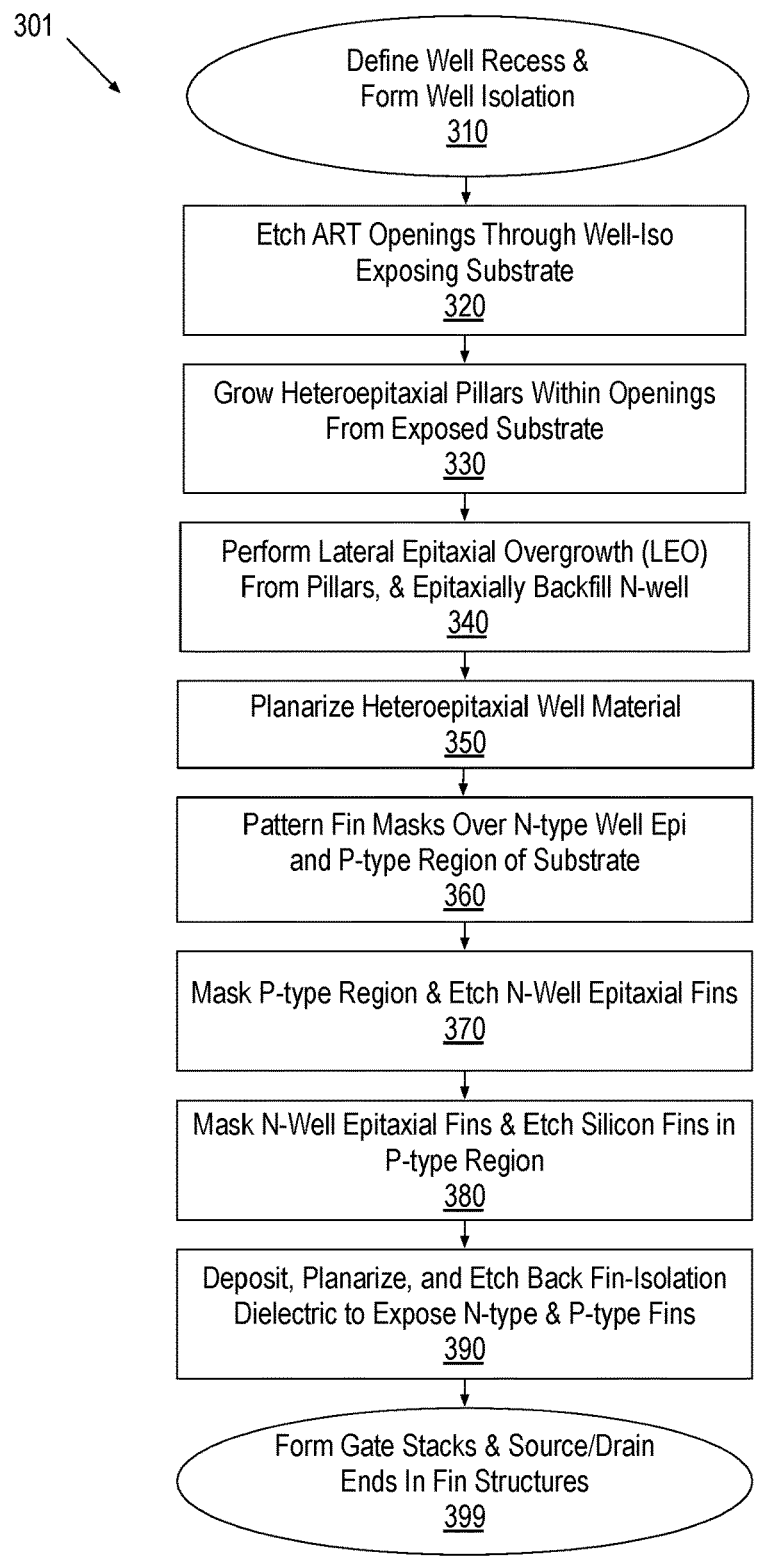
FIG. 3 is a flow diagram illustrating a method of fabricating a pair of complementary finFETs utilizing well-based heteroepitaxial n-type fins integrated with p-type fin structures as depicted in FIG. 1A, in accordance with some embodiments.
Figure 4A:
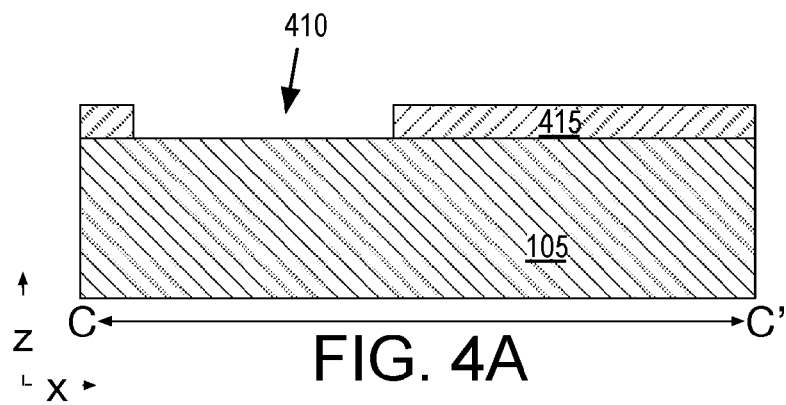
FIGS. 4A, 4B, 4C, 4D, 4E, 4F, 4G, 4H, 4I, 4J, 4K, 4L, 4M, and 4N are cross-sectional views of n-type and p-type fin structures evolving as the method illustrated in FIG. 3 is performed, in accordance with some embodiments.

The monolithically integrated heteroepitaxial n-type fin structures, p-type fin structures, and transistors incorporating them may be fabricated by a variety of methods applying a variety of techniques and processing chamber configurations. FIG. 3 is a flow diagram illustrating a method 301 for fabricating a pair of complementary finFETs utilizing a plurality of monolithically integrated n-type and p-type fin structures, in accordance with some embodiments. Method 301 may be practiced for example to generate the monolithic n-type and p-type fin structure 101 illustrated in FIG. 1A and to further form complementary finFETs from such fin structures. FIGS. 4A-4N and 5A-5D are referenced in the discussion of method 301. FIG. 4A-4N are cross-sectional views of n-type and p-type fin structures along the C-C' line depicted in FIG. 1A evolving as initial stages of method 301 are performed, in accordance with some embodiments. FIG. 5A-5D further illustrate formation of complementary finFETs in accordance with some embodiments.

Referring first to FIG. 3, method 301 begins at operation 310 where a first well recess is defined in an unmasked portion of the substrate and the well bottom is covered with well-isolation material. FIG. 4A further illustrates a hardmask 415 disposed on a working surface of silicon substrate 105, covering a region that will host P-type fin structures. Hardmask 415 is patterned with a first well mask opening 410 that exposes a surface of substrate 105. Hardmask 415 may be of any composition known in the art to be suitable for masking a deep silicon etch, such as, but not limited to silicon dioxide, silicon nitride, silicon oxynitride, and carbon-based hardmask materials (e.g., diamond-like carbon).

Figure 4B:
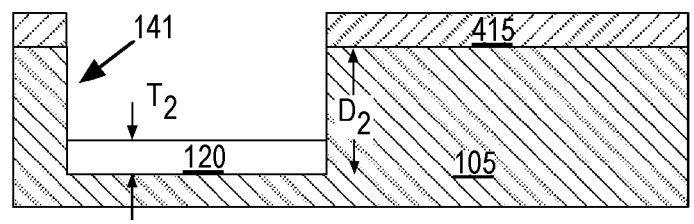

As further illustrated in FIG. 4B, well recess 141 is etched into substrate 105, for example with any known anisotropic silicon etch process (e.g., dep/etch/dep, etc.). The etch depth $D_2$ may be microns deep (e.g., 2-10 μm). Amorphous well-isolation material 120 is then backfilled into well recess 141, planarized over substrate 105, and recessed etched to a predetermined target thickness $T_1$ at the bottom of well recess 141. Any of the materials described above for well-isolation material 120 may be deposited by any known deposition technique, reflowed, and/or polished. Any etch process known to be suitable for the selected well-isolation material 120 may be employed to recess to the film to the thickness $T_1$.

Figure 4C:
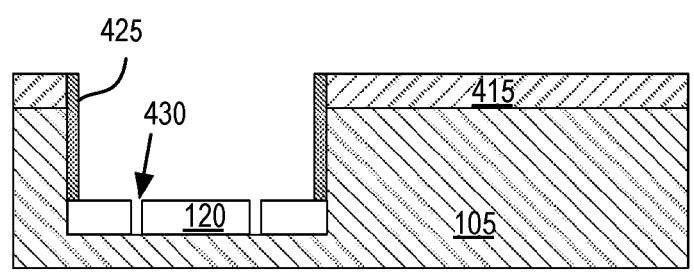

Returning to FIG. 3, method 301 continues at operation 320 where one or more ART openings are etched into the well-isolation material to expose single-crystalline seeding surface(s) at the bottom of the well recess. Any known patterning technique may be employed at operation 320. For one exemplary embodiment further illustrated in FIG. 4C, a plurality of ART openings 430 are etched through the well-isolation material $T_1$. In some embodiments, each ART opening 430 is a polygon with a nominal lateral CD of less than 10 μm, advantageously less than 4 μm, and more advantageously between 0.1 and 2 μm. In some advantageous bi-directional ART embodiments, each ART opening 430 has substantially the same nominal CD in x and y lateral dimensions (i.e., ART opening 430 is square or round). In some embodiments further illustrated by FIG. 4C, an amorphous well spacer 425 is formed along sidewalls of the well recess before forming ART openings 430. Well spacer 425 may be any dielectric material, such as silicon nitride for example. Any known deposition and anisotropic etch may be employed to form well spacer 425 extending up to well mask 415.

Returning to FIG. 3, method 301 proceeds to operation 330 where a heteroepitaxy process is performed to grow crystalline pillars within the ART openings. Amorphous well masking, amorphous well-isolation, and amorphous well spacers limit heteroepitaxial growth to seeding surfaces at the bottom of the ART windows. In some embodiments, a group III-V material is grown in the ART openings at operation 330 using any known epitaxial growth technique, such as, but not limited to, metal-organic chemical vapor deposition (MOCVD), molecular beam epitaxy (MBE), or hydride vapor phase epitaxy (HYPE). At operation 340, the epitaxial process continues with a lateral epitaxy overgrowth (LEO) from the pillars in the ART openings. The LEO process may be continued until a continuous crystalline material spans the well recess footprint between well recess spacers. The LEO process, or an epitaxial growth process having higher vertical growth rate conditions, is then continued until the heteroepitaxial material completely backfills the etch recess and extends proud of the well recess mask.

Figure 4D:
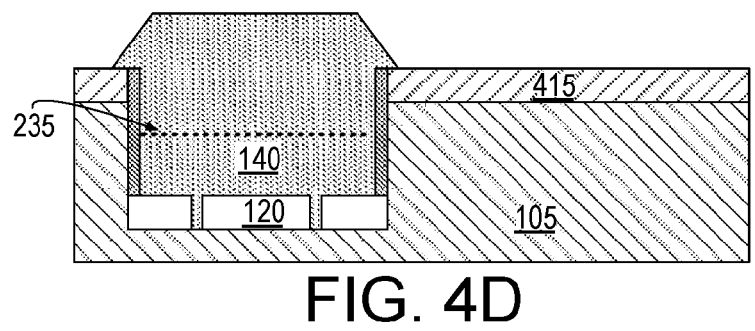

In some embodiments, elevated temperatures of 800° C., or more, are employed at operation 330 and 340 to epitaxially grow a III-V monocrystalline pillar and well material. Operation 330 may rely on first epitaxial growth conditions (e.g., a first III-V growth pressure, a first III-V growth temperature, and a first V/III growth precursor ratio), and may further include multiple growth conditions if a nucleation layer is first grown upon the substrate seeding surface. When the ART pillar is substantially backfilled, growth conditions may be changed at operation 340 to favor laterally growing the III-V crystalline structure over the well-isolation material. In some embodiments, as illustrated in FIG. 4D, the epitaxial backfilling process is continued until the III-V crystalline material extends beyond the well recess mask 415, forming inclined sidewall facets, for example. A transistor channel may ultimately be formed from III-V material grown during a last epitaxial backfilling stage. In some hetero-fin embodiments, the heteroepitaxial backfilling process performed at operation 340 (FIG. 3) further entails changing from the LEO growth conditions to new growth conditions having a different V/III growth precursor ratio that forms heterojunction 235 during the epitaxial backfilling process.

Figure 4E:
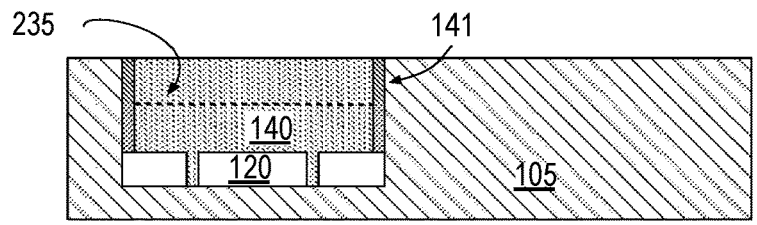

Returning to FIG. 3, at operation 350 the heteroepitaxial crystalline well material is planarized, for example down to a level of the well mask or substrate surface underlying the well mask. In an exemplary embodiment illustrated in FIG. 4E, crystalline well material 140 is planarized to be planar with a top surface of substrate 105 adjacent to well recess 141, removing well recess mask 415.

Figure 4F:
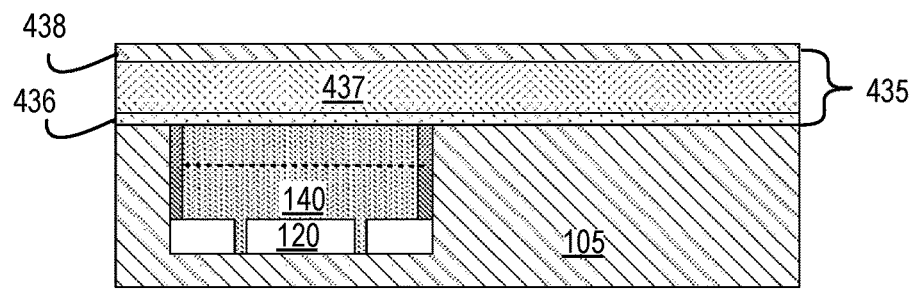
Figure 4G:
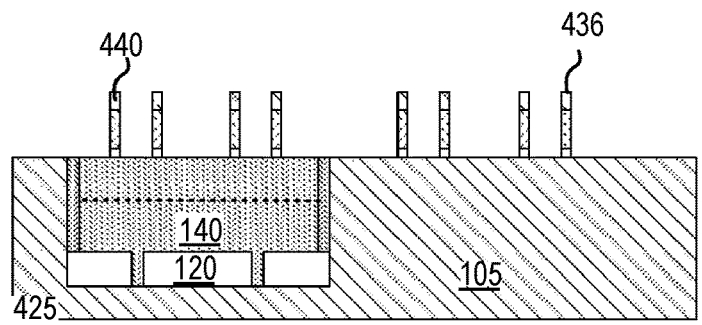

Method 301 (FIG. 3) continues with operation 360, which entails patterning fin masks over both the n-type crystalline well material and the p-type region. Any hardmask material or stack of hardmask materials known to be suitable for fin structure etching may be deposited at operation 360 and patterned using any conventional lithography and etch techniques suitable for the lateral geometries and mask materials. In an exemplary embodiment illustrated in FIG. 4F, a composite fin mask material 435 employing one or more interface materials 436, 438 separated by a bulk mask material 437 is deposited. FIG. 4G further illustrates concurrent patterning of mask material 435 into p-type fin masks 436 and n-type fin masks 440.

Figure 4H:
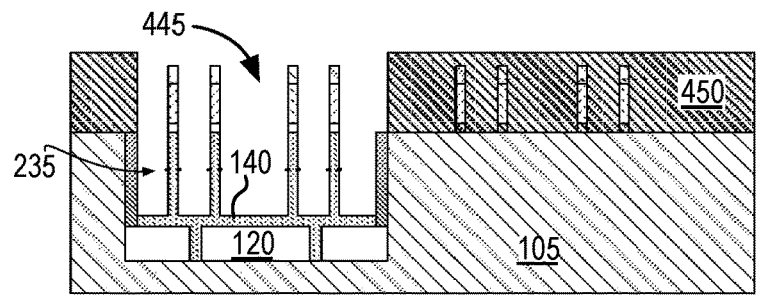

Returning to FIG. 3, method 301 continues with patterning fin structures into the n-type heteroepitaxial well material and p-type substrate material. The p-type region is masked first while n-type well material is etched into fin structures at operation 370, and n-type region is subsequently masked while p-type well material is etched at operation 380. In the exemplary embodiment illustrated in FIG. 4H, an anisotropic etch 445 recesses portions of well material 140 not protected by fin masks 440 to form fin structures in alignment with fin mask 440. An anisotropic n-type fin etch 445 is performed while p-type fin masks 436 are protected by an overlying masking material 450, such as a diamond-like carbon material. In exemplary III-V embodiments, n-type fin etch 445 may be any known process for the chosen III-V composition.

Figure 4I:
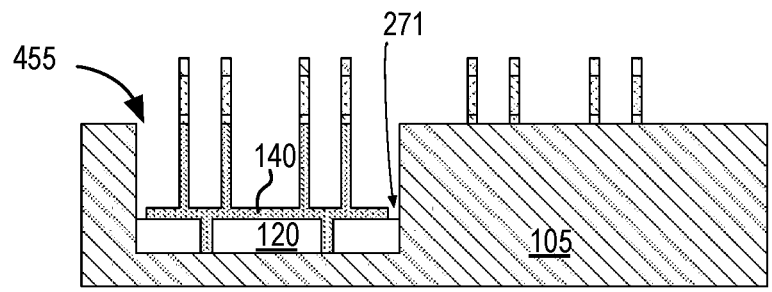
Figure 4J:
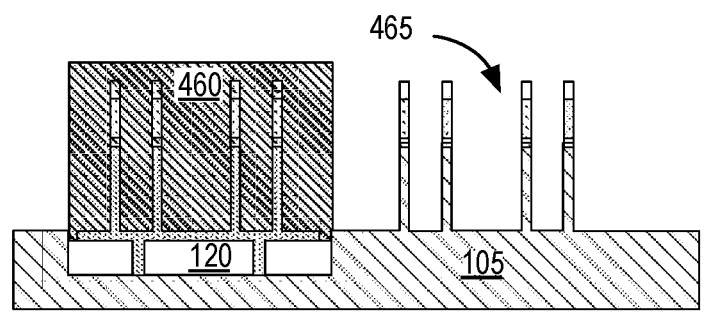
Figure 4K:
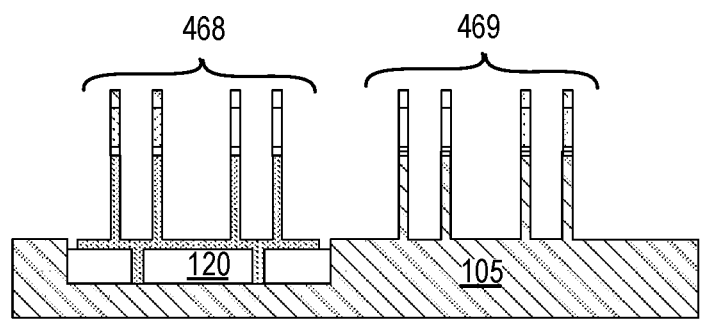

As further illustrated in FIG. 4I, masking material 450 is removed with any known process. A spacer clean out 455 is performed to remove the well-recess sidewall spacer, exposing sidewalls of substrate 105 and leaving a lateral gap 271 between well material 140 and substrate 105. As further illustrated in FIG. 4J, an anisotropic p-type fin etch 465 is performed while n-type fin masks 436 are protected by an overlying masking material 450, such as a diamond-like carbon material. In exemplary silicon substrate embodiments, p-type fin etch 465 may be any known anisotropic silicon etch process. Masking material 450 is then removed to arrived at the plurality of masked n-type fin structures 468 and masked n-type fin structures 469 illustrated in FIG. 4K.

Figure 4L:
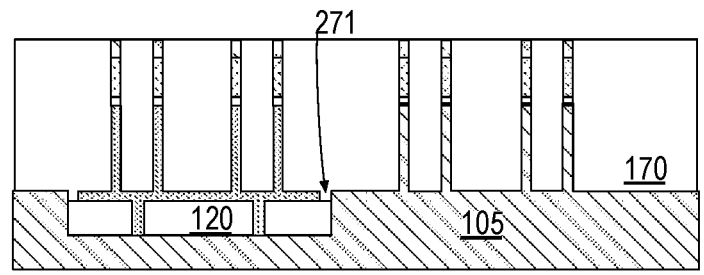
Figure 4M:
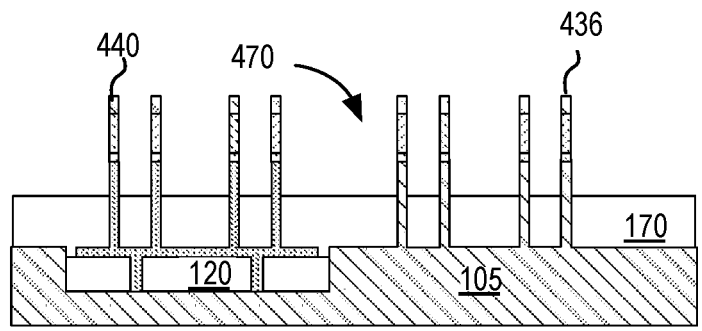
Figure 4N:
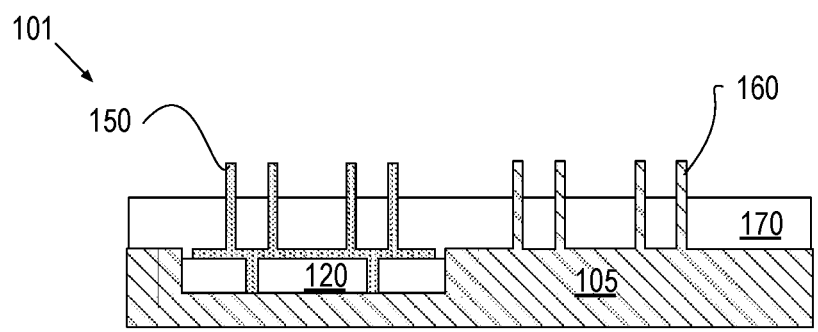
Figure 5A:
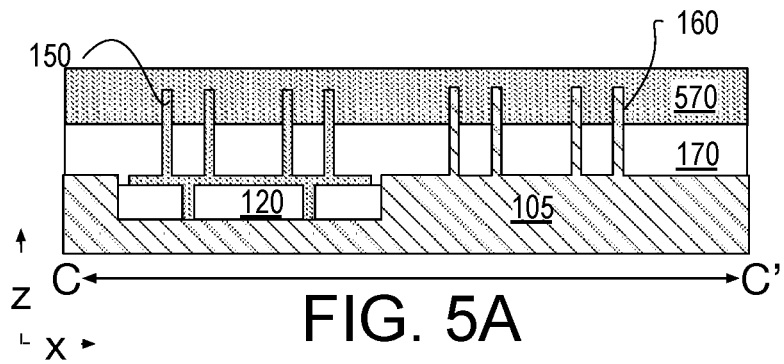
FIGS. 5A, 5B, 5C, and 5D are cross-sectional views of channel regions of n-type and p-type finFETs evolving as a gate replacement process is performed, in accordance with some embodiments.
Figure 5B:
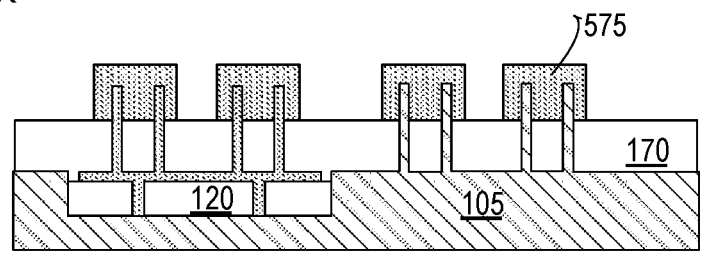
Figure 5C:
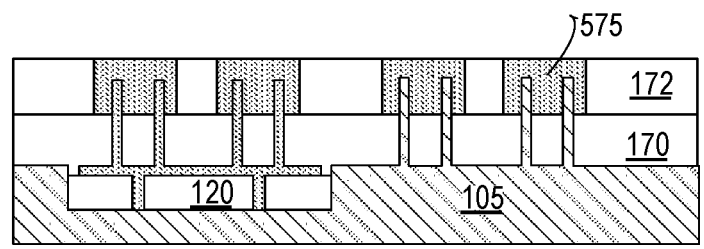
Figure 5D:
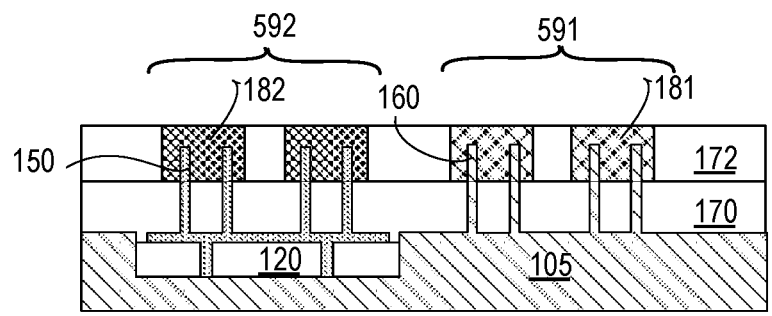

Returning to FIG. 3, method 301 continues at operation 390 during which a fin-isolation dielectric is deposited, planarized, and recessed to expose uppermost portions of the n-type and p-type fin structures. Any of the fin-isolation materials described above may be deposited at operation 390 using any known technique suitable to back fill the masked fin structures as embodiments are not limited in this respect. In the exemplary embodiments illustrated in FIG. 4L, fin-isolation material 170 backfills the masked fin structures and backfills lateral gap 271 to contact well-isolation 120. As further depicted in FIG. 4M, a planarization polish is then performed, followed by any known recess etch 470 to concurrently expose a targeted portion of the n-type and p-type fin structures. P-type and n-type fin masks 436, 440 are then stripped off to arrive at the monolithic n-type and p-type structure 101 introduced above in the context of FIG. 1A.

Method 301 then completes at operation 399 where the heteroepitaxial n-type and p-type fin structures are processed into finFETs. Operation 399 entails, for example, forming gate stacks and source/drain ends, which may proceed by any known technique. FIG. 5A-5D are cross-sectional views of channel regions of n-type and p-type finFETs along the C-C' line depicted in FIG. 1A evolving as a gate replacement (gate-last) process is performed, in accordance with some embodiments.

In a gate replacement process, a gate stack mandrel is formed over channel regions of n-type and p-type fin structures. Any known sacrificial gate structure and fabrication techniques may be employed. In some embodiments, forming the gate stack mandrel entails dielectric deposition/planarization, patterning an opening in the dielectric exposing the fin structure, and backfilling the opening with a sacrificial gate stack. In alternative embodiments illustrated by FIG. 5A, sacrificial gate stack material 570 is blanket deposited over the n-type and p-type fin structures. As further illustrated in FIG. 5B, sacrificial gate stack material 570 is patterned into gate mandrel 575. In the example illustrated, sacrificial gate mandrel 575 is formed on at least two sidewalls of the fin structures 150, 160, and lands on fin-isolation 170. A spacer dielectric (not depicted) may be further formed along sidewalls of fin structure 150, 160 and gate mandrel 575 using any conventional technique. Subsequent to forming the gate mandrel, doped regions are formed at the source/drain ends of the fin structures (out of the plane of FIG. 5B). In some embodiments, a raised source/drain region is formed on one or more of fin structures 150, 160 by depositing on the source/drain ends a first heavily-doped semiconductor of any composition suitable for n-type device and/or p-type devices. As further illustrated in FIG. 5C, an interlayer dielectric (ILD) 172 is then deposited and planarized with the gate mandrel 575.

Gate mandrel 575 is then removed selectively relative to ILD 172 exposing fin material and fin-isolation material 170. Following gate mandrel removal, a permanent gate stack is formed over at least two sidewalls of the fin structures. As further illustrated in FIG. 5D, a gate stack 181 is deposited over p-type fin structure 160 to complete a plurality of p-type (PMOS) transistors 591. A gate stack 182 is deposited over n-type fin structure 150 to complete a plurality of n-type (NMOS) transistors 592. While any known gate stack materials may be utilized, in one exemplary embodiment a high-k material with a bulk relative dielectric constant of 9, or more is employed along with a gate metal having a work function suitable for the composition of n-type fin structure 150 (e.g., III-V) and/or for the composition of p-type fin structure 160 (e.g., Si). The well-based integration of heteroepitaxial n-type transistors with p-type transistors is then substantially complete in the form illustrated in FIG. 5D. Using any conventional metallization, PMOS and NMOS FETs 591, 592 may then be interconnected into a CMOS circuit, such as a 6T SRAM cell. Any conventional backend interconnect metallization may also be employed to form CMOS circuitry of a processor, memory, or both in a System-On-Chip (SOC).

Figure 6:
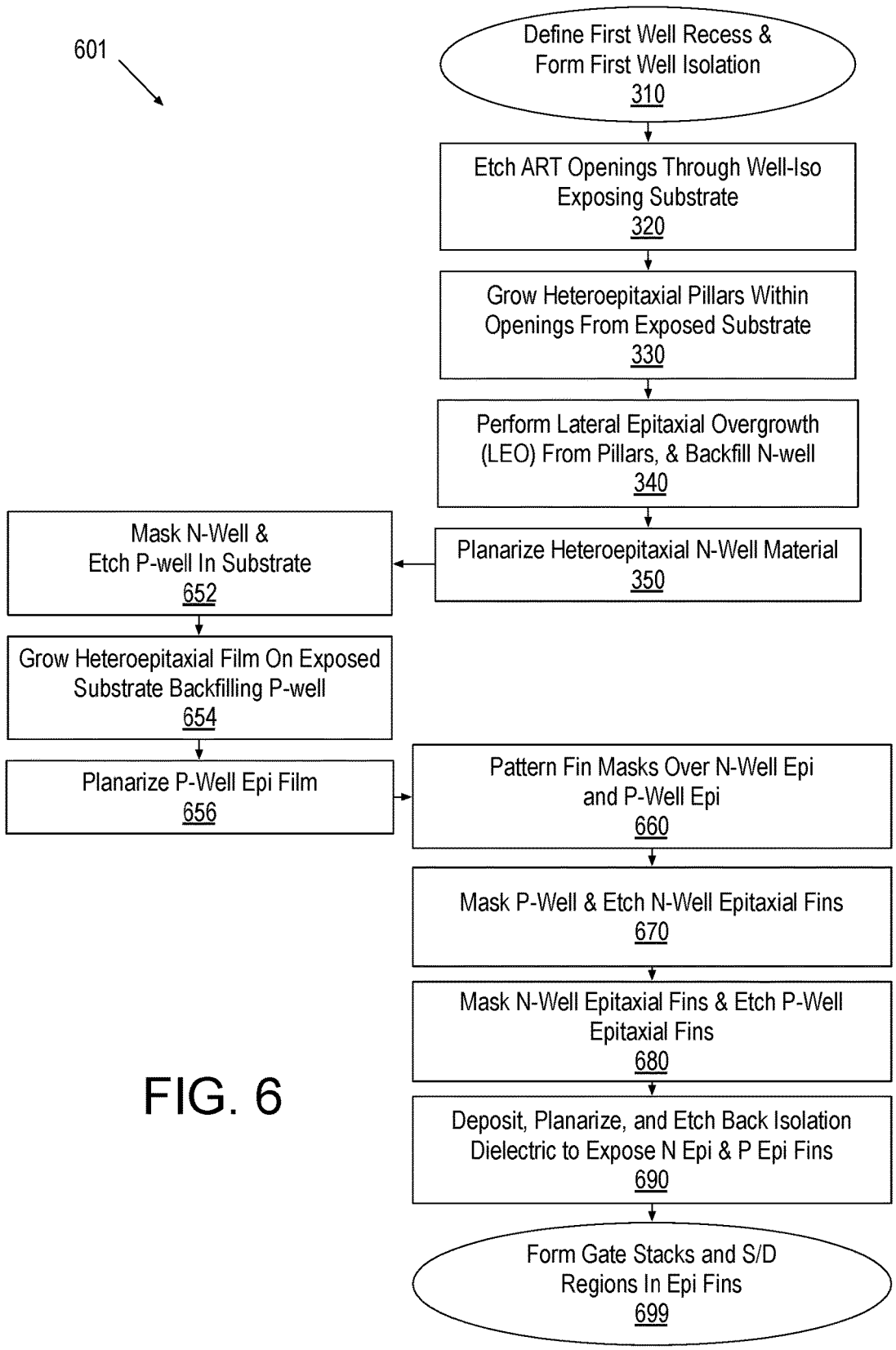
FIG. 6 is a flow diagram illustrating a method of fabricating a pair of complementary finFETs utilizing a plurality of well-based heteroepitaxial n-type fins structures integrated with a plurality of p-type fin structures as depicted in FIG. 1B, in accordance with some embodiments.

FIG. 6 is a flow diagram illustrating a method 601 for fabricating a pair of complementary finFETs utilizing a plurality of well-based heteroepitaxial n-type integrated with p-type fin structures as depicted in FIG. 1B, in accordance with some embodiments. Method 601 is an extension of method 301 in which a second well recess is epitaxially backfilled with p-type well material. Method 601 entails performance of operations 310, 320, 330, 340 and 350 substantially as described above to form one or more heteroepitaxially backfilled n-well recesses planarized with the adjacent substrate. At operation 652, a mask is formed over the backfilled n-well recess(es) and one or more p-well recesses are etched into the substrate, for example substantially in the manner described above for the n-well recess(es). At operation 654, a heteroepitaxial film is grown on the exposed substrate surfaces within the p-well recess(es). For example, SiGe may be formed in unmasked portions of the p-well recess(e). The p-well epitaxial material is then planarized with a top surface of the n-type heteroepitaxial material at operation 656. With the two heteroepitaxial well materials planarized, method 601 proceeds in substantially the same manner as method 301. For example, at operation 660 a fin mask is patterned over the n-type epitaxial well material and the p-type epitaxial well material. Fin structures are patterned into the n-type epitaxial well material and the p-type epitaxial well material at operations 670, 680. Fin-isolation material is deposited, planarized and recess etched at operation 690 to expose the electrically isolated epitaxial n-type and p-type fin structures. At operation 699, gate stacks and source/drain regions are formed in the fin structures to complete method 601.

Figure 7:
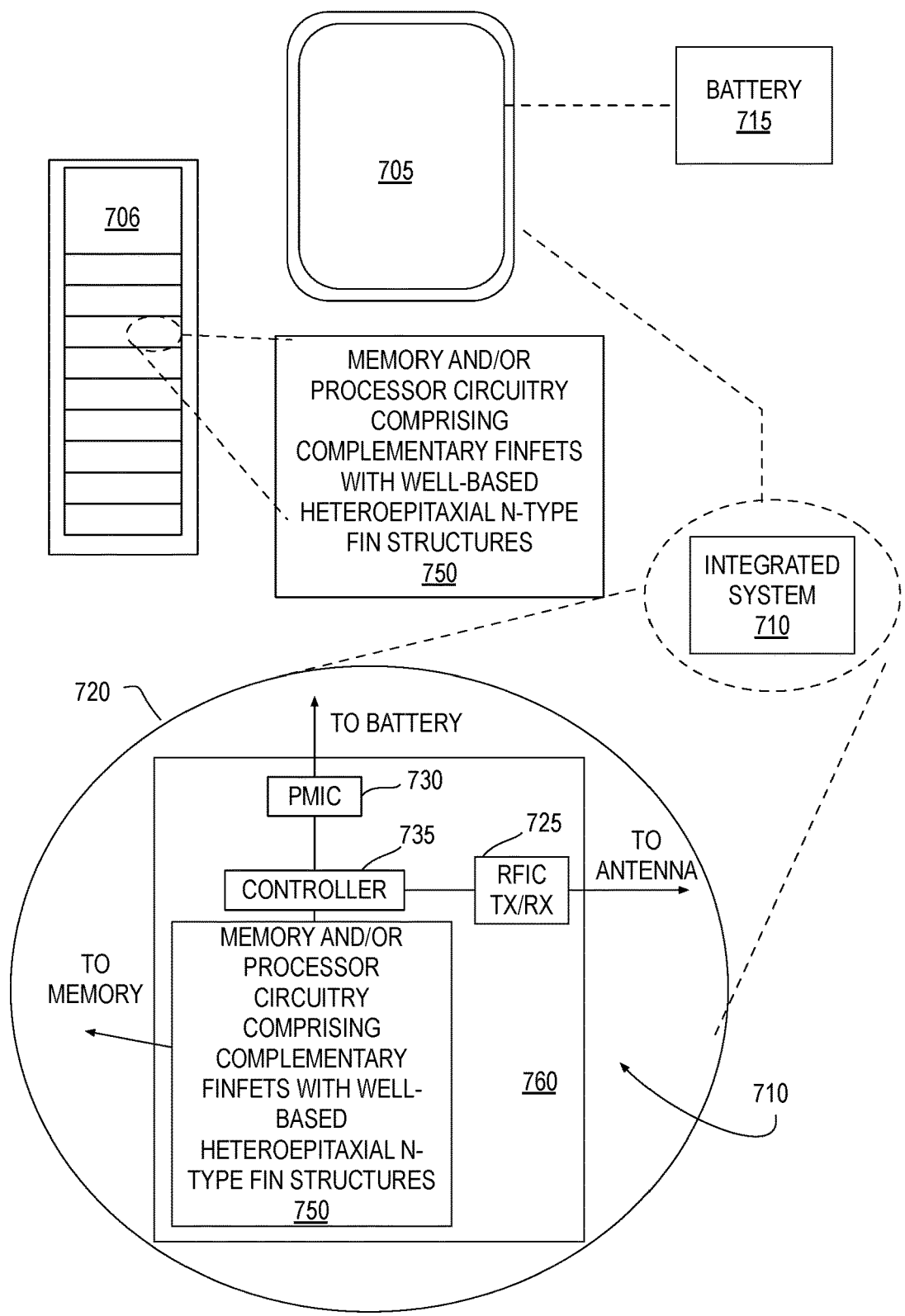
FIG. 7 illustrates a mobile computing platform and a data server machine employing an SoC including complementary finFETs utilizing a plurality of well-based heteroepitaxial n-type fins structures integrated with a plurality of p-type fin structures, in accordance with embodiments of the present invention.

FIG. 7 illustrates a mobile computing platform and a data server machine employing an SoC including heteroepitaxial n-type transistors with p-type transistors monolithically integrated based on laterally overgrown heteroepitaxial well material and ART structures, for example as describe elsewhere herein. The server machine 706 may be any commercial server, for example including any number of high-performance computing platforms disposed within a rack and networked together for electronic data processing, which in the exemplary embodiment includes a packaged monolithic SoC 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 715.

Whether disposed within the integrated system 710 illustrated in the expanded view 720, or as a stand-alone packaged chip within the server machine 706, packaged monolithic SoC 750 includes a memory block (e.g., RAM), a processor block (e.g., a microprocessor, a multi-core microprocessor, graphics processor, or the like) including at least one non-silicon n-type channeled FET (e.g., a III-V channeled FET) monolithically integrated with at least one silicon channeled p-type FET based on laterally overgrown heteroepitaxial well material and ART structures, for example as describe elsewhere herein. The monolithic SoC 750 may be further coupled to a board, a substrate, or an interposer 760 along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprises a power amplifier on a transmit path and a low noise amplifier on a receive path), and a controller 735.

Functionally, PMIC 730 may perform battery power regulation, DC-to-DC conversion, etc., and so has an input coupled to battery 715 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 750.

Figure 8:
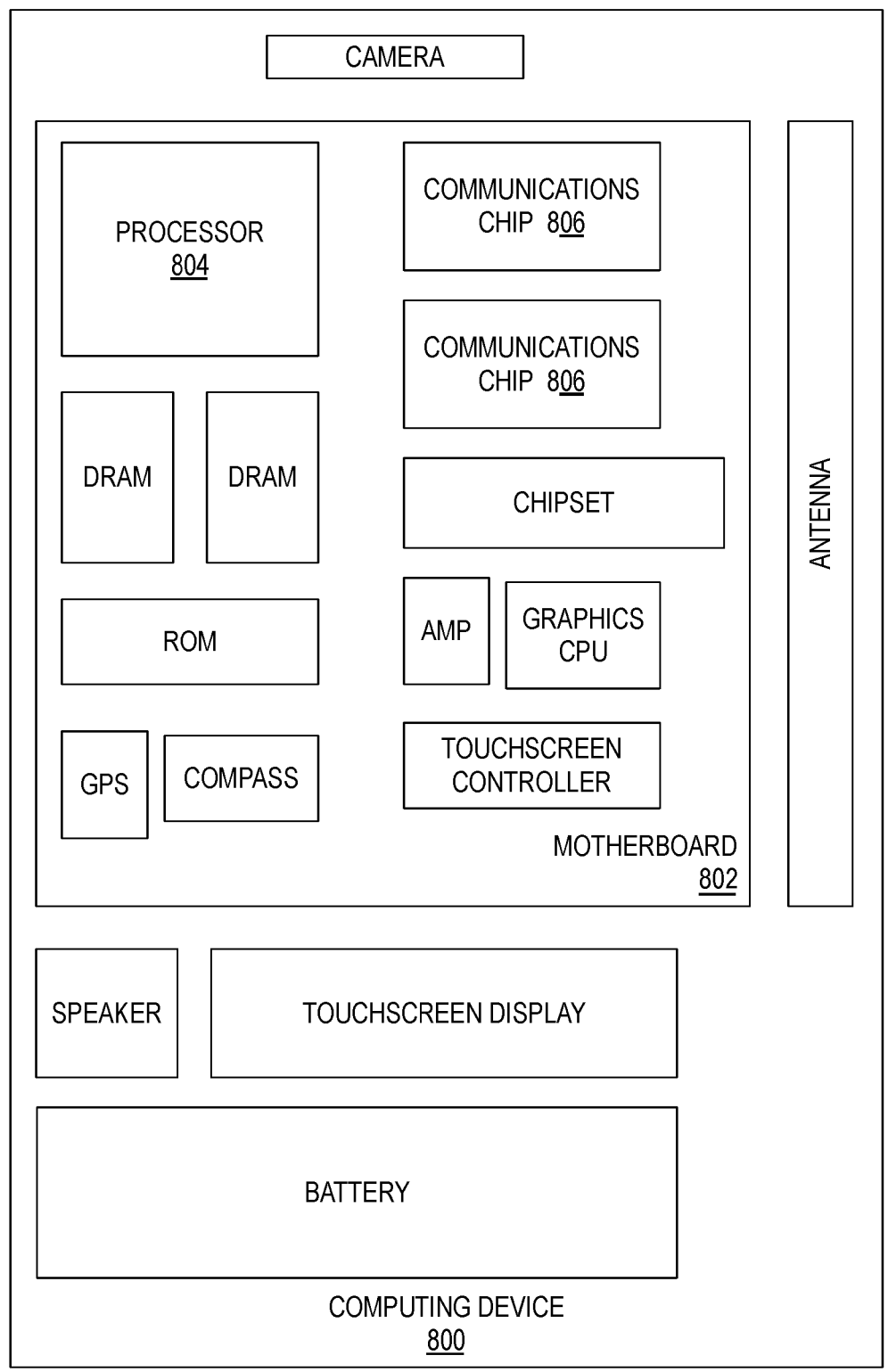
FIG. 8 is a functional block diagram of an electronic computing device, in accordance with an embodiment of the present invention.

FIG. 8 is a functional block diagram of an electronic computing device, in accordance with an embodiment of the present invention. Computing device 800 may be found inside platform 705 or server machine 706, for example. Device 800 further includes a motherboard 802 hosting a number of components, such as, but not limited to, a processor 804 (e.g., an applications processor), which may further incorporate at least one non-silicon n-type channeled FET (e.g., a III-V channeled FET) monolithically integrated with at least one silicon channeled p-type FET based on laterally overgrown heteroepitaxial well material and ART structures, for example as describe elsewhere herein. Processor 804 may be physically and/or electrically coupled to motherboard 802. In some examples, processor 804 includes an integrated circuit die packaged within the processor 804. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, monolithic semiconductor fin structures comprise a first well recess in a first region of a substrate, the first well recess containing an amorphous well-isolation material disposed over the well bottom, and a single-crystalline heteroepitaxial well material disposed over the well-isolation material, wherein the well material is coupled to a seeding surface of the substrate at the well bottom by one or more pillar of heteroepitaxial material extending through the well-isolation material. The fin structures further comprise an amorphous fin-isolation material disposed over the first well recess and over a second region of substrate adjacent to the first region, a first crystalline fin extending from the well material and protruding through the fin-isolation material, and a second fin of a group IV material extending from the second region of substrate and protruding through the fin-isolation material.

In at least some of the first embodiments, a minimum lateral dimension of the first well is at least an order of magnitude larger than a longest lateral dimension of the pillar.

In at least some of the first embodiments, the amorphous fin-isolation material extends around a sidewall of the crystalline heteroepitaxial material disposed over the well-isolation material, electrically insulating the crystalline heteroepitaxial material from the second region of the substrate.

In at least some of the embodiments immediately above, the fin-isolation material contacts the well-isolation material.

In at least some of the first embodiments, the first crystalline heteroepitaxial fin has a threading dislocation density that is at least three orders of magnitude smaller than that of the crystalline heteroepitaxial pillar material.

In at least some of the first embodiments, a minimum lateral dimension of the first well recess is at least 100 µm, a longest lateral dimension of the pillar is less than 4 µm, the pillar has an aspect ratio of at least 2:1, and a minimum lateral dimension of the first and second fin is less than 10 nm.

In at least some of the first embodiments, a first surface of the well material from which the first fin extends is planar with a second surface in the second region from which the second fin extends.

In at least some of the first embodiments, the fin structures further comprise a second well recess in the second region of the substrate, the second well recess containing a single-crystalline group IV well material comprising Ge, and the second fin comprises a group IV material selected from the group consisting of Si, Ge, and SiGe.

In at least some of the first embodiments, the pillar material comprises a single-crystalline III-V material forming a first heterojunction with the substrate, and the heteroepitaxial material of the first fin forms a second heterojunction with the well material.

In at least some of the embodiments immediately above, the substrate comprises silicon, the first fin comprises InGaAs, and the second fin comprises silicon.

In one or more second embodiments, an integrated circuit (IC), comprises a plurality of n-type finFETs extending from one body of single-crystalline III-V material contained within a well recess in a first region of a crystalline silicon substrate, the well recess lined with a dielectric well-isolation material except for one or more pillars of the crystalline III-V material that are coupled to a seeding surface of the substrate through the well-isolation material, and the IC further comprises a plurality of p-type finFETs extending from a second region of the crystalline silicon substrate.

In at least some of the second embodiments, the plurality of n-type finFETs are arrayed over a first lateral dimension of the well recess, and the one or more pillars of crystalline III-V material comprises a plurality of pillars arrayed over the first lateral dimension and a second lateral dimension, orthogonal to the first lateral dimension.

In one or more third embodiment, a method of fabricating a pair of complementary field effect transistors comprises etching a first well recess in a first region of a crystalline silicon substrate. The method further comprises backfilling the first well recess with a dielectric well-isolation material to level below the substrate surface in a second region beyond the first well recess. The method further comprises forming one or more openings through the well-isolation material that expose a crystalline substrate surface at the well bottom. The method further comprises heteroepitaxially growing a monocrystalline pillar comprising a III-V material on the exposed substrate surface within the one or more openings. The method further comprises laterally overgrowing a monocrystalline III-V material from the pillar and backfilling a remainder of the first well recess with monocrystalline III-V material. The method further comprises planarizing a surface the backfilled III-V material with a substrate surface in a second region. The method further comprises patterning a fin mask over first and second regions. The method further comprises etching first fins into overgrown III-V material and etching second fins into the second region. The method further comprises forming a gate stack over the first and second fins. The method further comprises forming contact metallization coupled to source/drain ends of the first and second fins.

In at least some of the third embodiments, the method further comprises depositing an amorphous fin isolation dielectric over the first and second fins, the fin isolation dielectric covering a sidewall of the overgrown III-V material.

In at least some of the third embodiments immediately above, the method further comprises depositing the fin-isolation material onto the well-isolation material to laterally separate the overgrown III-V material from a crystalline material in the second region.

In at least some of the third embodiments, the method further comprises etching a second well recess in the second region of a crystalline silicon substrate, epitaxially growing a single-crystalline group IV well material comprising Ge, and etching the second fins into the group IV material.

In at least some of the third embodiments, the method further comprises forming the one or more openings through the well-isolation material further comprises etching one or more opening having a longest lateral dimension that is at least an order of magnitude smaller that a minimum lateral dimension of the first well recess.

In at least some of the third embodiments, the method further comprises forming an amorphous spacer material on a sidewall of the well recess not covered by well-isolation material to prevent seeding heteroepitaxially growth of the III-V material on the well recess sidewall, and removing the spacer material before depositing the amorphous fin isolation dielectric into a recess left by the spacer material removal.

In at least some of the third embodiments, heteroepitaxially growing the monocrystalline pillar and laterally overgrowing the monocrystalline III-V material from the pillar further comprises growing a first of GaAs, InP, InAs, InGaAs, AlGaAs, GaP, AlAs, InGaP, and backfilling a remainder of the first well recess with monocrystalline III-V material further comprises heteroepitaxially growing a second of GaAs, InP, InAs, InGaAs, AlGaAs, GaP, AlAs, InGaP.

In at least some of the third embodiments, the method further comprises masking the planarized backfilled III-V material, etching a second well recess in a second region of the crystalline silicon substrate, backfilling the second well recess by heteroepitaxially growing a material comprising Ge, and planarizing a surface of the backfilled material comprising Ge to be planar with a surface of the backfilled III-V material.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. Integrated circuit (IC) structures, comprising:
a well recess in a first region of a substrate, the well recess containing an amorphous well-isolation material over a bottom of the well recess, and a crystalline well material over the well-isolation material, wherein the well material is coupled to a seeding surface of the substrate at the bottom of the well recess by a crystalline pillar material that extends through the well-isolation material;
an amorphous fin-isolation material over a first surface of the well material, and over a second surface in a second region of the substrate adjacent to the first region wherein the first surface is substantially planar with the second surface; and
a first fin comprising a first crystalline material, wherein the first fin extends from the first surface of the well material and protrudes through the fin-isolation material to a first height over the fin-isolation material; and
a second fin comprising a second crystalline material, wherein the second fin extends from the second surface of the second region of the substrate and protrudes through the fin-isolation material to a second height over the fin-isolation material, the second height being substantially equal to the first height.

2. The IC structures of claim 1, wherein a minimum lateral dimension of the well recess is at least an order of magnitude larger than a longest lateral dimension of the pillar material.

3. The IC structures of claim 1, wherein the fin-isolation material extends around a sidewall of the well material, electrically insulating the well material from the second region of the substrate.

4. The IC structures of claim 3, wherein the fin-isolation material contacts the well-isolation material.

5. The IC structures of claim 1, wherein:
the first fin has a threading dislocation density that is at least three orders of magnitude smaller than that of the pillar material.

6. The IC structure of claim 2, wherein:
a minimum lateral dimension of the well recess is at least 100 μm;
a longest lateral dimension of the pillar material is less than 4 μm;
the pillar material has an aspect ratio of at least 2:1; and
a minimum lateral dimension of the first fin is less than 10 nm and the minimum lateral dimension of the second fin is less than 10 nm.

7. The IC structures of claim 1, wherein the well recess is a first well recess and the IC structure further comprises:
a second well recess in the second region of the substrate, the second well recess containing a crystalline well material comprising Ge; and
wherein second fin comprises at least one of Si and Ge.

8. The IC structures of claim 1, wherein:
the pillar material comprises a Group III-V alloy and a first heterojunction comprises the pillar material and the substrate; and
a second heterojunction comprises the first crystalline material and the well material.

9. The IC structures of claim 8, wherein:
the substrate comprises silicon;
the first fin comprises at least one of In, Ga, and As; and
the second fin comprises silicon.

10. An integrated circuit (IC), comprising:
an n-type finFET extending from one body of crystalline III-V material, the crystalline III-V material within a well recess in a first region of a crystalline silicon substrate, the well recess lined with a dielectric material, and wherein one or more pillars of the crystalline III-V material extend through the well-isolation material and couple to a seeding surface of the substrate;
a p-type finFET in a second region of the crystalline silicon substrate; and
a fin-isolation material over the well recess and over the second region, wherein the fin-isolation material extends around a sidewall of the crystalline III-V material, electrically insulating the well material from the second region of the substrate.

11. The IC of claim 10, wherein:
the n-type finFET is one of a plurality of n-type finFETs over a first lateral dimension of the well recess; and
the one or more pillars of crystalline III-V material comprises a plurality of pillars arrayed over the first lateral dimension and a second lateral dimension, orthogonal to the first lateral dimension.

12. A method of fabricating a pair of complementary field effect transistors, the method comprising:
etching a well within a first region of a crystalline silicon substrate;
backfilling the well with a dielectric material;
forming one or more openings through the dielectric material that expose the substrate at a bottom of the well;
epitaxially growing a crystalline pillar comprising a Group III-V alloy on the substrate expose within the openings;
laterally overgrowing a III-V material from the pillar;
planarizing the III-V material with a second region of the substrate;
forming first fins in the III-V material, and forming second fins in the second region;
forming first gate stacks over the first fins, and forming second gate stacks of the second fins; and
forming contact metallization to a source and drain ends of the first and second fins.

13. The method of claim 12, further comprising depositing a second dielectric material over the first and second fins, the second dielectric material covering a sidewall of the III-V material.

14. The method of claim 13, further comprising laterally separating the laterally overgrown III-V material from a crystalline material in the second region by depositing the second dielectric material on the first dielectric material.

15. The method of claim 13, further comprising:
forming an amorphous spacer material on a sidewall of the well not covered by the dielectric material; and
removing the spacer material before depositing the second dielectric material into a recess left by the spacer material removal.

16. The method of claim 12, wherein the well is a first well, and the method further comprises:
etching a second well within the second region;
epitaxially growing a well material comprising Ge within the second well; and
etching the second fins into the well material comprising Ge.

17. The method of claim 12, wherein:
forming the openings through the well-isolation material further comprises etching an opening having a longest lateral dimension that is at least an order of magnitude smaller than a minimum lateral dimension of the well.

18. The method of claim 12, wherein:
growing the pillar and laterally overgrowing the III-V material from the pillar further comprises growing a first alloy comprising GaAs, InP, InAs, InGaAs, AlGaAs, GaP, AlAs, or InGaP; and
a remainder of the well is backfilled with a III-V material by heteroepitaxially growing a second alloy comprising GaAs, InP, InAs, InGaAs, AlGaAs, GaP, AlAs, or InGaP.

19. The method of claim 12, further comprising:
masking the planarized III-V material;
etching a second well in a second region of the substrate;
heteroepitaxially growing a material comprising Ge in the second well; and
planarizing a surface of the material comprising Ge with a surface of the III-V material.

20. Integrated circuit (IC) structures, comprising:
a well recess in a first region of a substrate, the well recess containing an amorphous well-isolation material over a bottom of the well recess, and a crystalline well material over the well-isolation material, wherein the well material is coupled to a seeding surface of the substrate at the bottom of the well recess by a crystalline pillar material that extends through the well-isolation material;
an amorphous fin-isolation material over the well recess and over a second region of the substrate adjacent to the first region, wherein the fin-isolation material extends around a sidewall of the well material, electrically insulating the well material from the second region of the substrate; and
a first fin comprising a first crystalline material, wherein the first fin extends from the well material and protrudes through the fin-isolation material; and
a second fin comprising a second crystalline material, wherein the second fin extends from the second region of the substrate and protrudes through the fin-isolation material.

* * * * *